(12) United States Patent
Huang et al.

(10) Patent No.: US 10,517,183 B1
(45) Date of Patent: Dec. 24, 2019

(54) HOLDING AND RELEASE DEVICE FOR SLIDING CHASSIS IN SERVER

(71) Applicant: NANNING FUGUI PRECISION INDUSTRIAL CO., LTD., Nanning (CN)

(72) Inventors: Ying-Jui Huang, New Taipei (TW); Chih-Hsuan Lin, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 0 days.

(21) Appl. No.: 16/260,400

(22) Filed: Jan. 29, 2019

(51) Int. Cl.
  *H05K 5/02* (2006.01)
  *H05K 7/14* (2006.01)

(52) U.S. Cl.
  CPC .......... *H05K 5/023* (2013.01); *H05K 5/0221* (2013.01); *H05K 7/1487* (2013.01); *H05K 7/1489* (2013.01); *H05K 7/1491* (2013.01)

(58) Field of Classification Search
  CPC .... H05K 5/023; H05K 5/0221; H05K 7/1487; H05K 7/1489; H05K 7/1491; H05K 5/00; H05K 5/02; H05K 7/14
  See application file for complete search history.

(56) References Cited

U.S. PATENT DOCUMENTS

| 9,253,912 | B2 | 2/2016 | Skirmont et al. |
| 9,733,678 | B2 * | 8/2017 | Chen ........................ G06F 1/18 |
| 2009/0294393 | A1 * | 12/2009 | Chen .................... H05K 7/1489 |
| | | | 211/175 |

* cited by examiner

*Primary Examiner* — Jinhee J Lee
*Assistant Examiner* — Ingrid D Wright
(74) *Attorney, Agent, or Firm* — ScienBiziP, P.C.

(57) ABSTRACT

A hold and release device of reduced size allowing the sliding of a server chassis relative to a rack includes a mounting assembly mounted to the server chassis. A fixing member is rotatably coupled to the mounting assembly and comprises a first protrusion to fasten the server chassis to the rack. A latching button is configured to latch the fixing member to the mounting assembly. A guiding member is connected to a button stage receives the latching button and has a sliding tunnel, and a handle slidably coupled to the guiding member is located in the sliding tunnel.

10 Claims, 11 Drawing Sheets

HOLDING AND RELEASE DEVICE FOR SLIDING CHASSIS IN SERVER

FIELD

The subject matter herein generally relates to holding and release devices in server casings.

BACKGROUND

Server chassis is a structure that is used to carry servers. A well-designed chassis enables carrying multiple servers and other peripheral equipment (such as SUP EP card, management card, line card, fabric card) in a single box or rack.

Generally, a server chassis includes a mechanism for facilitating moving the server chassis relative to a metal rack. However, the mechanism may be covered by cables connected to the chassis, and may be difficult to operate. In addition, the conventional mechanism is large, and takes up much space. Therefore, there is room for improvement within the art.

BRIEF DESCRIPTION OF THE DRAWINGS

Implementations of the present disclosure will now be described, by way of embodiments only, with reference to the attached figures.

DETAILED DESCRIPTION

Figure 1:
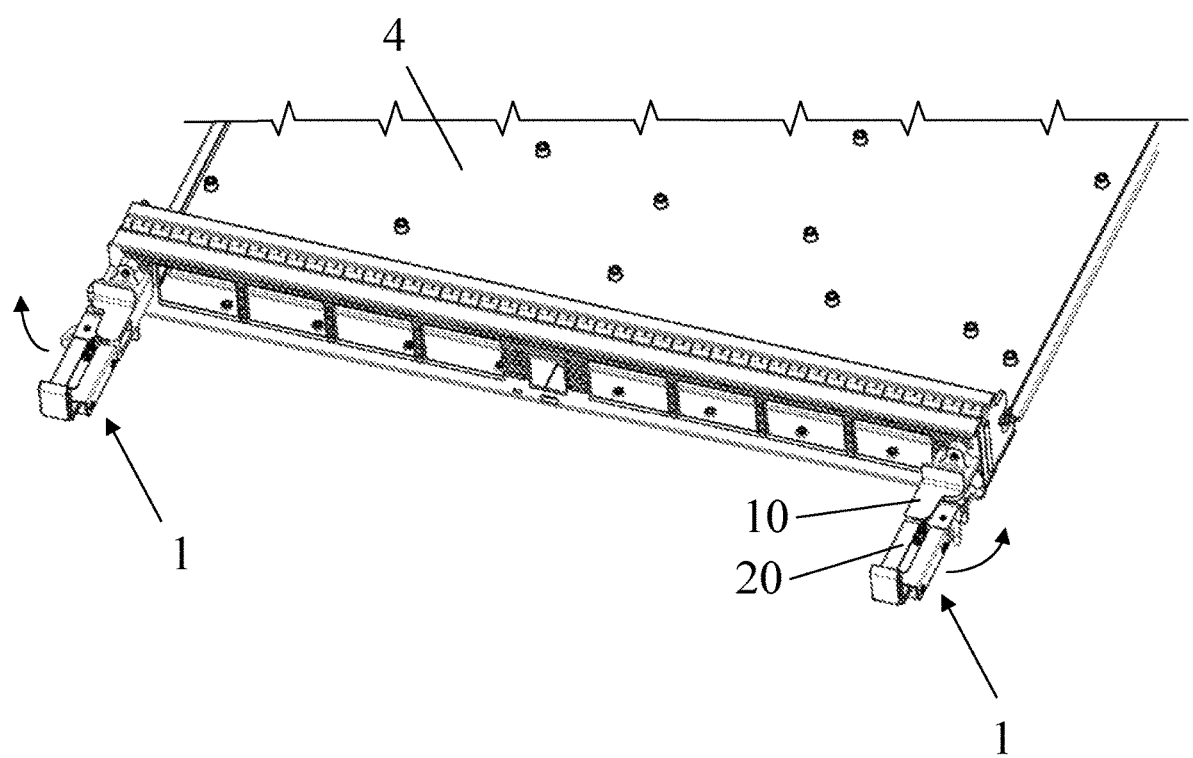
FIG. 1 shows a schematic view of a server chassis having two hold and release devices (HR devices), in accordance with a first embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and devices have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening devices, and is not necessarily limited to physical connections. The connection can be such that the objects are permanently connected or releasably connected. The term "substantially" is defined to be essentially conforming to the particular dimension, shape, or other feature that the term modifies, such that the device need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

FIG. 1 shows a schematic view of a server chassis 4 with two hold-and-release devices 1 (HR devices) fixed on a front surface thereof. In one embodiment, each of the HR devices 1 includes a mounting assembly 10 and a driving assembly 20. The mounting assembly 10 is mounted to the server chassis 4 and located at two ends of the server chassis 4. The driving assembly 20 is rotationally coupled to the mounting assembly 10. The server chassis 4 may be stored in or on a rack 3 (see FIG. 4). The HR device 1 is configured to fasten the server chassis 4 on the rack 3.

Figure 2:
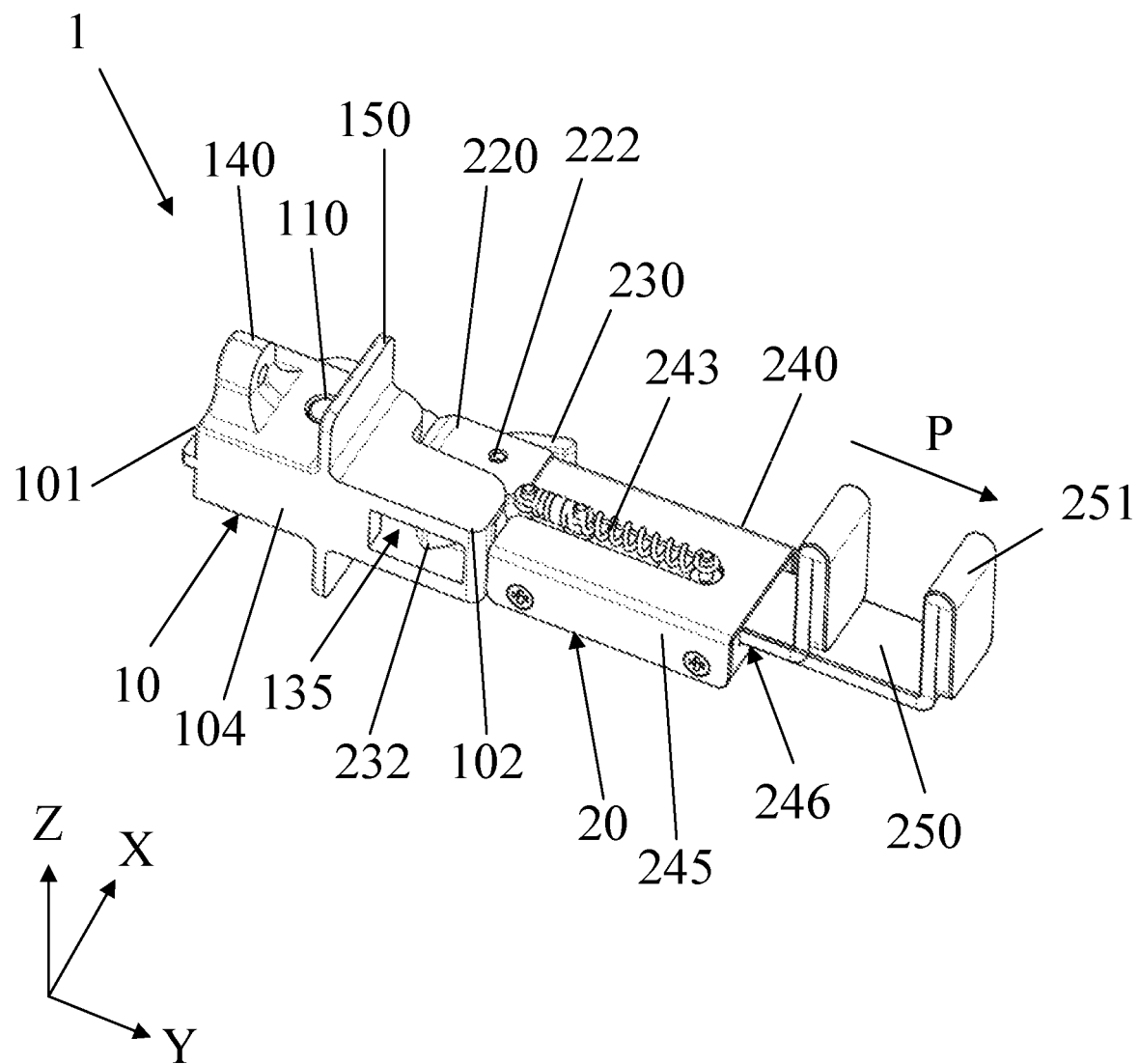
FIG. 2 shows a schematic view of a HR device in accordance with the first embodiment.
Figure 3:
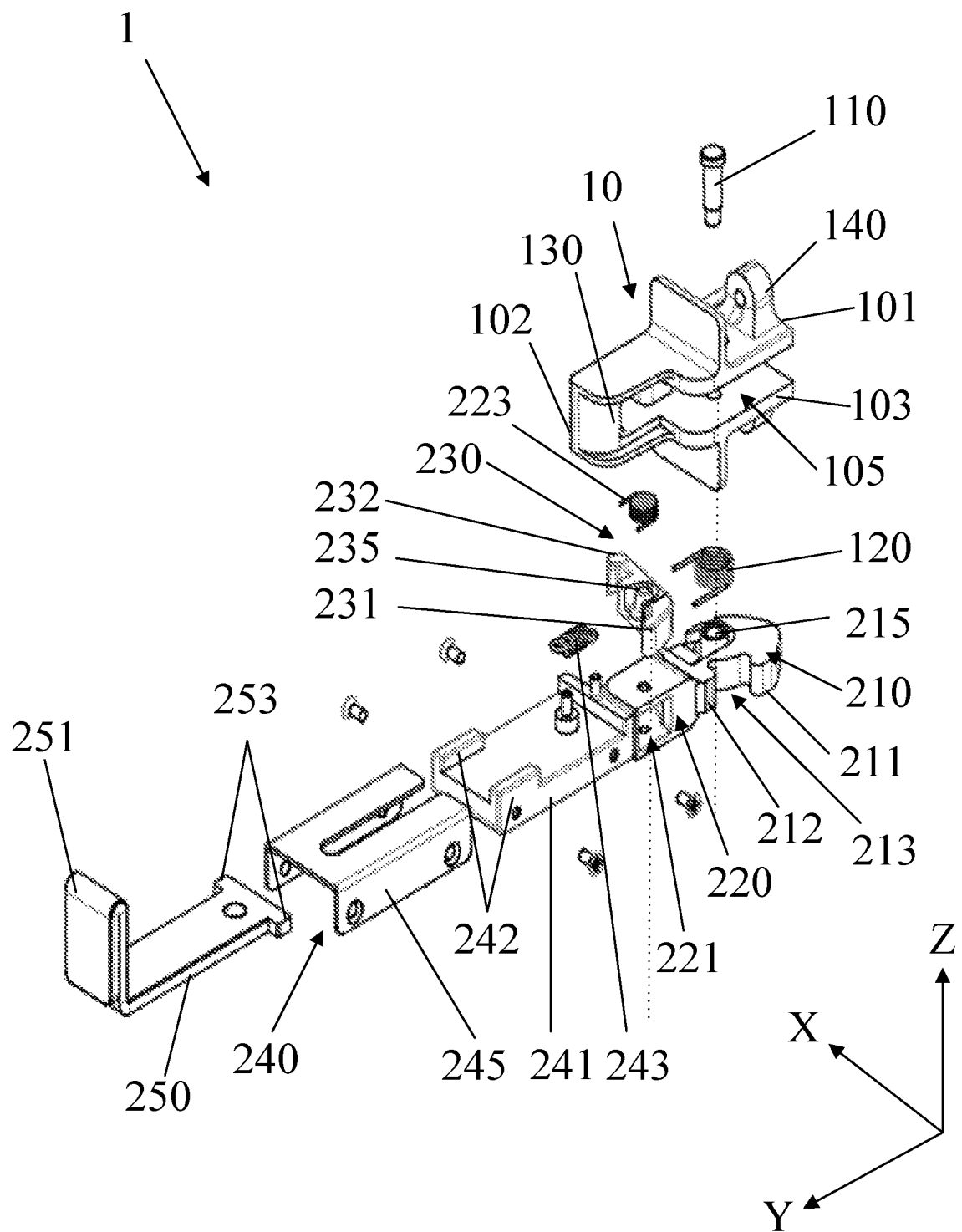
FIG. 3 shows an exploded view of the HR device in accordance with the first embodiment.

FIG. 2 shows a schematic view of the HR device 1 and FIG. 3 shows an exploded view of the HR devices 1 in accordance with one embodiment. In one embodiment, the mounting assembly 10 extends from an inner end 101 to an outer end 102 in a longitudinal direction (Y-axis direction) of the HR device 1. A portion of the mounting assembly 10 that is adjacent to the outer end 102 has a smaller width than an opposite portion of the mounting assembly 10 that is adjacent to the inner end 101.

A groove 105 (see FIG. 3) is formed on a lateral sidewall 103 of the mounting assembly 10. A shaft 110 is positioned in the groove 105 and located adjacent to the inner end 101 of the mounting assembly 10. The shaft 110 facilitates the rotation of the driving assembly 20. A buckle 130 is positioned in the groove 105 and located adjacent to the outer end 102 of the mounting assembly 10.

An opening 135 (see FIG. 2) which is located adjacent to the buckle 130 may be formed on another lateral side wall 104 of the mounting assembly 10, the opening 135 communicates with the groove 105. The opening 135 is configured to clear (avoid interference with) a latching button 230 (described later) with a bottom surface of the groove 105. Two mounting steps 140 are formed on upper and lower surfaces of the mounting assembly 10. The mounting steps 140 are configured to mount the mounting assembly 10 to the server chassis 4 (see FIG. 1) via, for example, screws.

The driving assembly 20 includes a fixing member 210, a button stage 220, a latching button 230, a guiding member 240, and a handle 250, in accordance with one embodiment.

The fixing member 210 has a shaft hole 215. The fixing member 210 is rotatably connected to the shaft 110 via the shaft hole 215 and located adjacent to the first end 101 of the mounting assembly 10. A resilient element 120 may be sleeved on the shaft 110 and connected to the fixing member 210 to restore a position of fixing member 210 after its rotation relative to the mounting assembly 10. The resilient element 120 may be a spring, such as a torsional spring.

In one embodiment, the fixing member 210 further includes a first protrusion 211 and a second protrusion 212 located on a lateral side wall of the fixing member 210. The shaft hole 215 is located between the first protrusion 211 and the second protrusion 212. The first protrusion 211 is distant from the second protrusion 212, and a recess 213 is located between the first protrusion 211 and the second protrusion 212. The first protrusion 211 and the second protrusion 212 are configured to abut against the rack 3 (FIG. 4) so as to limit the movement of the server chassis 4 or facilitate a sliding motion of the server chassis 4 relative to the rack 3 (described below). In one embodiment, the second protrusion 212 is omitted. The position of the server chassis 4 is limited by the first protrusion 211 and the rack 3.

The button stage 220 is coupled to the fixing member 210 and located adjacent to the second end 102 of the mounting assembly 10. A channel 221 is formed in the button stage 220. A shaft 222 (see FIG. 2) is positioned in the channel 221 and is configured to facilitate the rotation of the latching button 230.

The latching button 230 has a shaft hole 235. The latching button 230 is rotatably connected to the shaft 222 via the shaft hole 235. A rotation axis of the latching button 230 is perpendicular to the longitudinal direction (Y-axis direction) of the driving assembly 20. A resilient element 223 may be sleeved on the shaft 222 and connected to the latching button 230 to restore a position of the latching button 230 after its rotation. The resilient element 223 may be a spring, such as a torsional spring.

The latching button 230 further includes a pressing portion 231 and a hook portion 232 located on opposite sides of the latching button 230. The shaft hole 235 is located between the pressing portion 231 and the hook portion 232. The pressing portion 231 and the hook portion 232 both extend outside of the channel 221. The latching button 230 latches the driving assembly 20 to the mounting assembly 10 or releases the driving assembly 20 from the mounting assembly 10 by selectively engaging the hook portion 232 with the buckle 130.

The guiding member 240 includes a substrate 241 and a cover 245. The cover 245 is positioned on the substrate 241, and a sliding tunnel 246 (FIG. 2) is defined between the cover 245 and the substrate 241. The handle 250 is slidibly connected to the sliding tunnel 246. The sliding tunnel 246 guides the sliding movement of the handle 250 in a direction P that is parallel to the longitudinal direction (Y-axis direction) of the driving assembly 20.

In one embodiment, as shown in FIG. 3, two bumps 242 are formed on a top surface of the substrate 241. The two bumps 242 are located immediately adjacent to a front end edge of the substrate 241 and separated from each other by a distance that is slightly greater than a width of the handle 250. In addition, two position limiting parts 253 extend from opposite edges of the handle 250. The bumps 242 and the position limiting parts 253 limit the movement of the handle 250 in the direction P and dropping of the handle 250 out of the guiding member 240 is avoided.

In one embodiment, a resilient element 243 is connected between the substrate 241 and the handle 250. The resilient element 243 restore a position of the handle 250 after the handle 250 is slid out of the guiding member 240. The resilient element 243 is a spring, such as a compression spring. In an alternative embodiment, the resilient element 223 is omitted, and the handle 250 can be slid back manually into the guiding member 240 after its outward movement.

As shown in FIG. 2, a cable inner blade 150 is formed on an upper surface of the mounting assembly 10, and the handle 250 includes a cable outer blade 251 extending upwardly and facing the cable inner blade 150. The cable inner blade 150 and the cable outer blade 251 are of the same height and define a space for allowing cables (not shown in figures) that are connected to the server chassis 4 to pass therethrough. Therefore, cables can be neatly stored in the rack 3.

In one embodiment, the fixing member 210, the button stage 220, the guiding member 240, and the handle 250 are sequentially arranged along the longitudinal direction (Y-axis direction) of the driving assembly 20. A rotation axis of the fixing member 210 and the latching button 230 are perpendicular to the longitudinal direction (Y-axis direction). In addition, a sliding direction of the handle 250 is parallel to the longitudinal direction (Y-axis direction).

Figure 4:
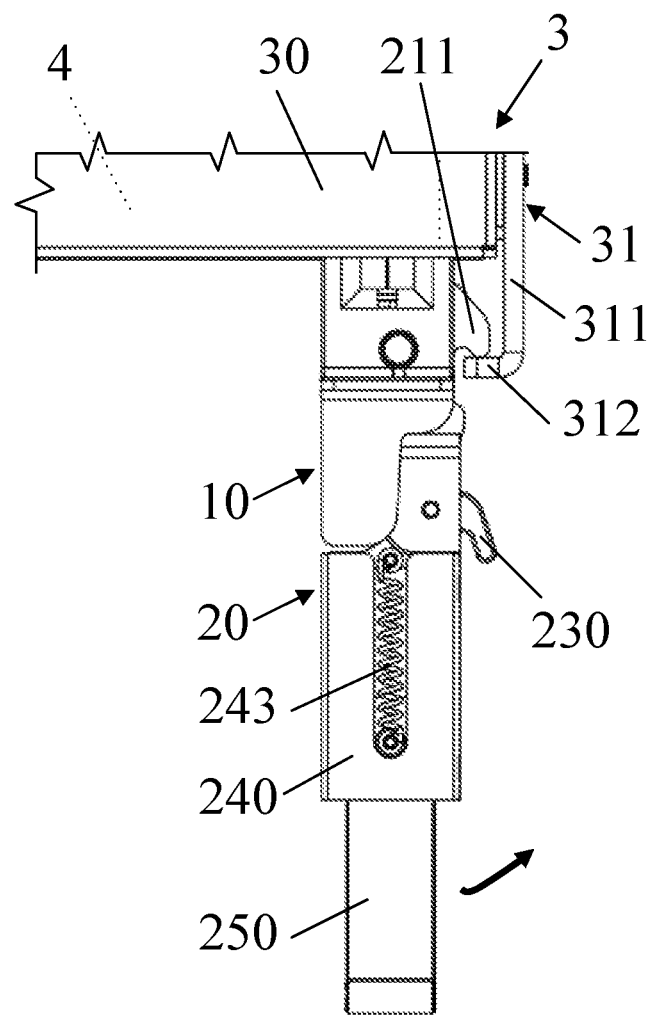
FIG. 4 shows a schematic view of a rack for a server chassis wherein a driving assembly is perpendicular to the server chassis.

FIG. 4 shows part of the server chassis 4 received in the rack 3. In one embodiment, the rack 3 includes a main body 30 for receiving the server chassis 4 and an engaging member 31. The engaging member 31 includes a side portion 311 and a bent portion 312. The side portion 311 is fixed on a sidewall of the main body 30, and the bent portion 312 is connected to an end of the side portion 311 and is perpendicular to the bent portion 312. The bent portion 312 is distant from a front surface of the main body 30. In one embodiment, a distance between the bent portion 312 and the main body 30 is equal to a distance between the first protrusion 211 of the driving assembly 20 and the server chassis 4 so that the movement of the server chassis 4 is limited when driving assembly 20 is latched on the mounting assembly 10, as shown in FIG. 4.

A method for removing the server chassis 4 from the rack 3, in accordance with one embodiment, is described below.

In one embodiment, before a removal process of the server chassis, the resilient element 243 is compressed, and the handle 250 is received within the guiding member 240. In addition, the first protrusion 211 abuts against the bent portion 312 so that the movement of the server chassis 4 relative to the rack 3 is limited. Moreover, the hook portion 232 of the latching button 230 latches the buckle 130 of the mounting assembly 10 so that the driving assembly 20 is latched on the mounting assembly 10 and rotation of the driving assembly 20 is restricted.

Figure 5:
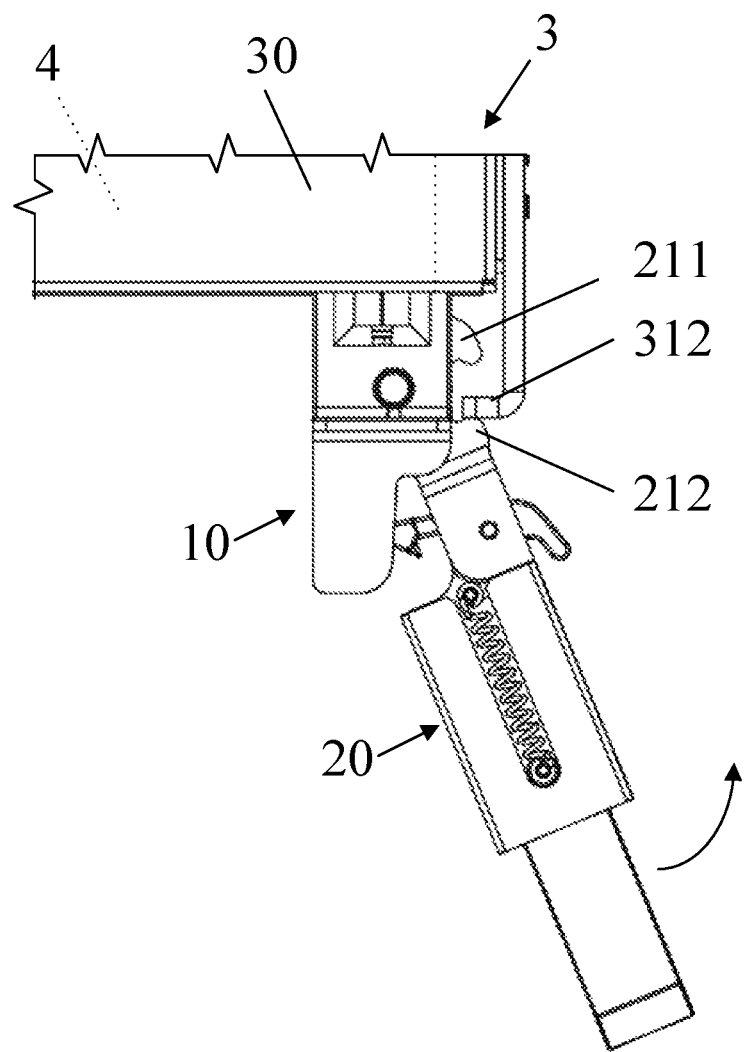
FIG. 5 shows a schematic view of the rack wherein a first protrusion of the driving assembly is in contact with a bent portion of the rack.

To pull the server chassis 4 out from the rack 3, the handle 250 is pulled, and the resilient element 243 is extended, as shown in FIG. 4. Then the latching button 230 is pressed to disengage the hook portion 232 from the buckle 130, and the driving assembly 20 is rotated about the mounting assembly 10 along the direction indicated by the arrow shown in FIG. 4 to cause the second protrusion 212 to abut the bent portion 312, as shown in FIG. 5. At this time, the rotation of the driving assembly 20 causes the server chassis 4 to be pulled out from the main body 30 of the rack 3. The increasing length of the driving assembly 20 means that less effort is needed to pull out the server chassis 4 according to the lever principle.

Figure 6:
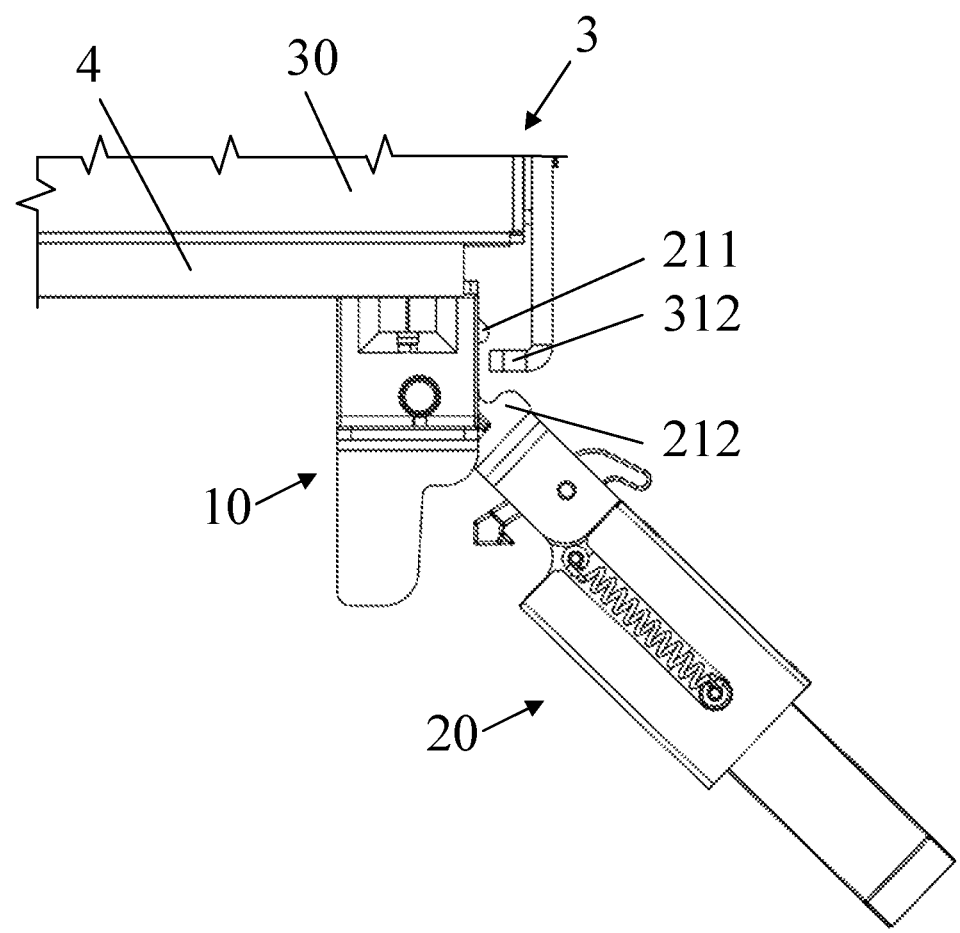
FIG. 6 shows a schematic view of the rack wherein a second protrusion of the driving assembly is in contact with a bent portion of the rack.

Afterwards, as shown in FIG. 6, when the driving assembly 20 is rotated to a predetermined angle relative to the server chassis 4, first protrusion 211 and the bent portion 312 are clear of each other and the first protrusion 211 can be moved past the engaging portion 310. As a result, the server chassis 4 can be pulled out of the rack 3. In one embodiment, the predetermined angle is 45 degrees.

When the server chassis 4 is completely pulled out of the rack 3, the handle 250 is received in the guiding member 240, and the driving assembly 20 can be retracted into the mounting assembly 10 where the latching button 220 is latched on the mounting assembly 10.

Figure 7:
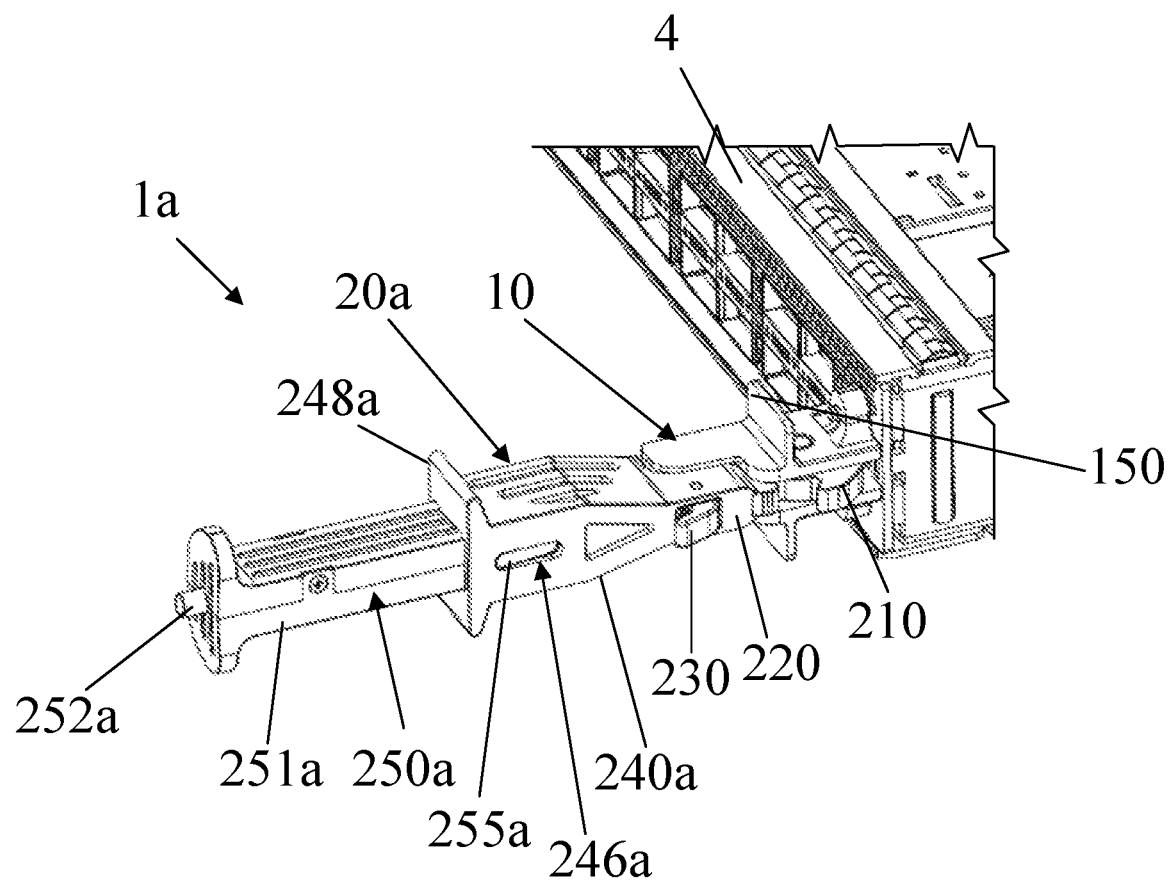
FIG. 7 shows a schematic view of a server chassis having one HR device in accordance with a second embodiment.
Figure 8:
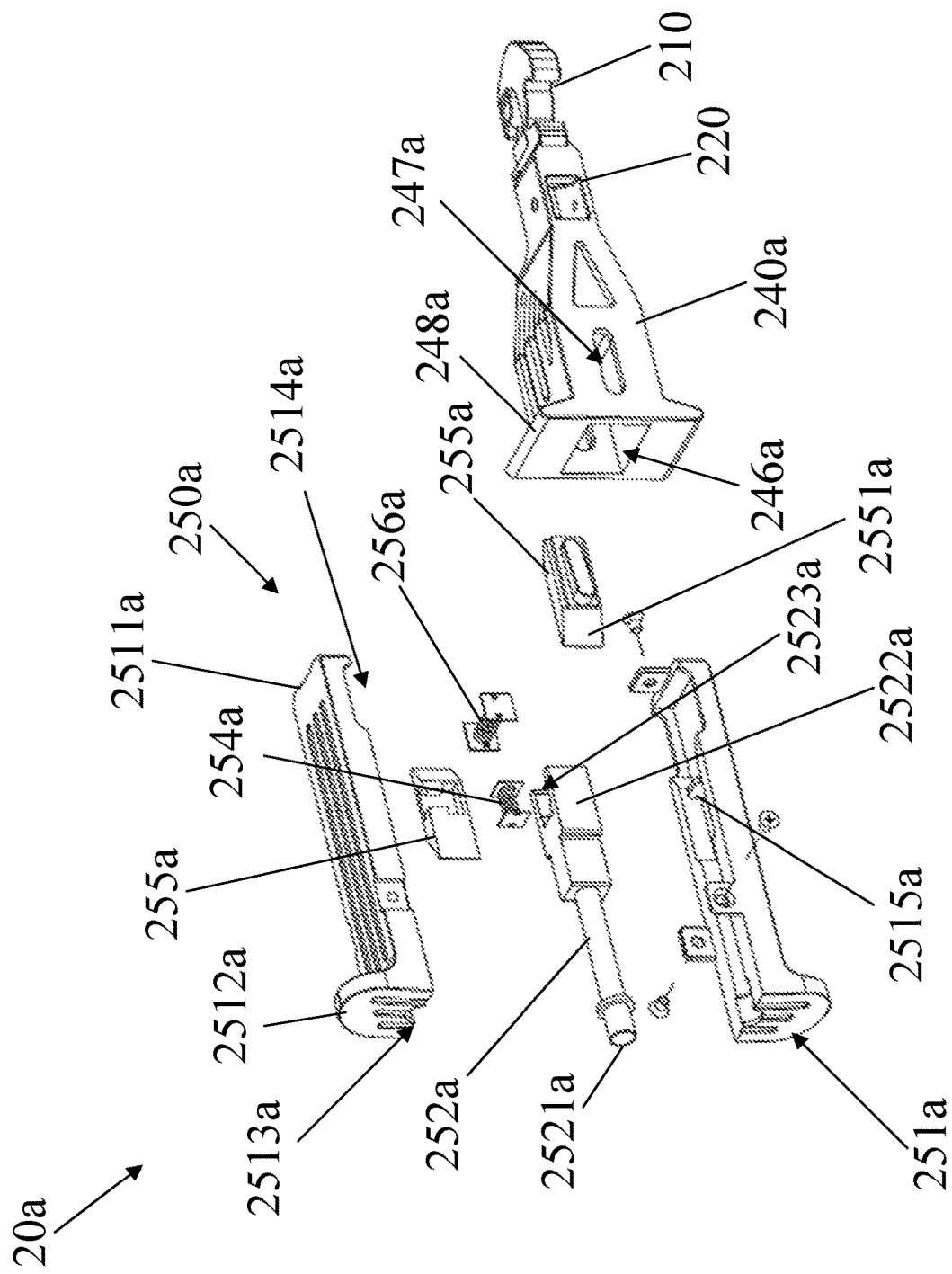
FIG. 8 shows an exploded view of the HR devices in accordance with the second embodiment.

FIG. 7 shows part of the server chassis 4 having a HR device 1a mounted thereon, and FIG. 8 shows an exploded view of a driving assembly 20a of the HR device 1a, in accordance with another embodiment. Structural features of the driving assembly 20a are similar to those of the driving assembly 20 and will not be repeated. Differences between the driving assembly 20a and the driving assembly 20 include the driving assembly 20a which includes a guiding member 240a and a handle 250a.

In one embodiment, the guiding member 240a is connected to the button stage 220. The guiding member 240a is hollow, a sliding tunnel 246a (see FIG. 8) is formed therein. The handle 250 is slidibly connected to the sliding tunnel 246. The sliding tunnel 246 guides the sliding movement of the handle 250 in a direction parallel to the longitudinal direction of the driving assembly 20. Through holes 247a are formed on opposite sidewalls of the guiding member 240a and located adjacent to the button stage 220.

The guiding member 240a further includes a cable outer blade 248a extending upwardly and facing the cable inner blade 150. The cable inner blade 150 and the cable outer blade 248a are of the same height and define a space for allowing cables (not shown in figures) that are connected to the server chassis 4 to pass therethrough. Therefore, cables can be neatly stored.

As shown in FIG. 8, the handle 250a includes a housing 251a, a control rod 252a, a first spring 254a, two blocks 255a, and a second spring 256a, in accordance with one embodiment. The housing 251a extends from an inner end 2511a to an outer end 2512a. The housing 251a is hollow. A rear opening 2513a is formed on the outer end 2512a and side openings 2514a located adjacent to the inner end 2511a are formed on opposite sidewalls of the housing 251a.

Figure 9:
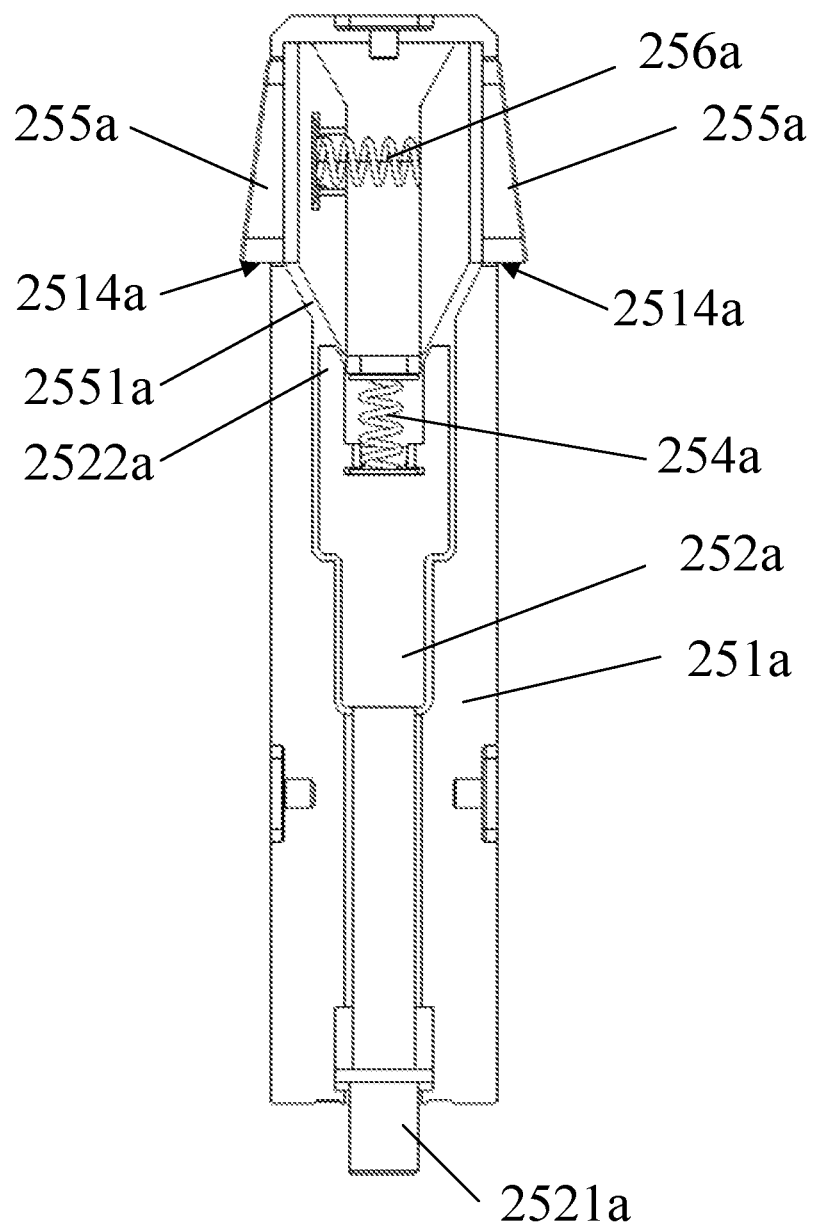
FIG. 9 shows a cross-sectional view of a handle of the HR device wherein a control rod is an original position, in accordance with the second embodiment.

Referring to FIG. 9, the control rod 252a extends in the housing 251a with a pushing part 2521a and an abutting part 2522a formed on opposite ends of the control rod 252a. The pushing part 2521a is exposed out of the housing 251a via the rear opening 2513a. The abutting part 2522a has a U-shaped cross-section with a recess 2523a formed in its middle portion. The spring 254a is positioned in the recess 2523a and is fixed to a limitation part 2515a formed within the housing 251a.

The two blocks 255a are positioned in the housing 251a and arranged to correspond to the two side openings 2514a (FIG. 8). The spring 256a is positioned between the two blocks 255a and keeps the two blocks 255a exposed out of the two side opening 2514a. As shown in FIG. 7, when the handle 250a is mounted in the guiding member 240a, the two blocks 255a are inserted into the through holes 247a so that the handle 250a is fixed on the guiding member 240a for removal or installation of the server chassis 4.

Figure 10:
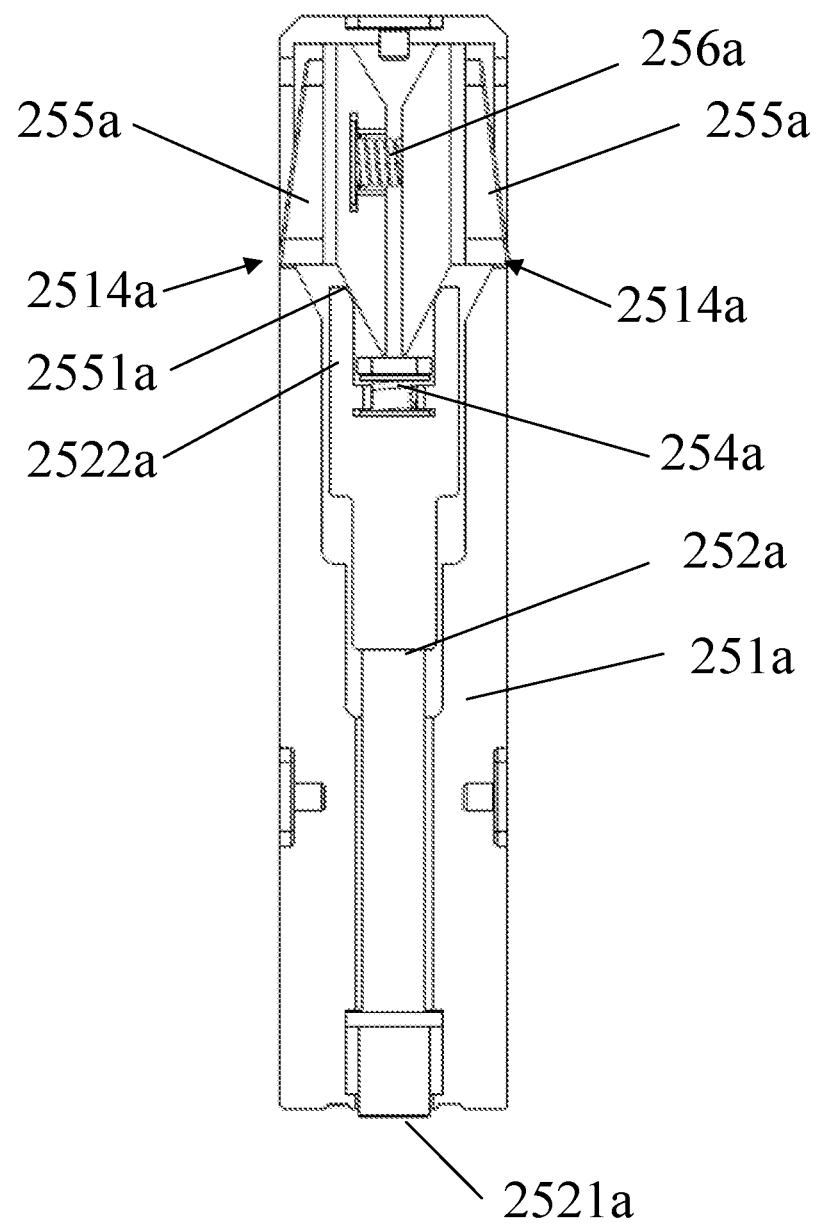
FIG. 10 shows a cross-sectional view of a handle of the HR device wherein a control rod is an operation position, in accordance with the second embodiment.

As shown in FIG. 10, each of the blocks 255a has an inclined surface 2551a directly facing two ends of the abutting part 2522a. When an external force is applied on the control rod 252a to move the control rod 252a toward and abut against the inclined surface 2551a, the two blocks 255a are pushed inwardly and are retracted into the housing 251a.

Figure 11:
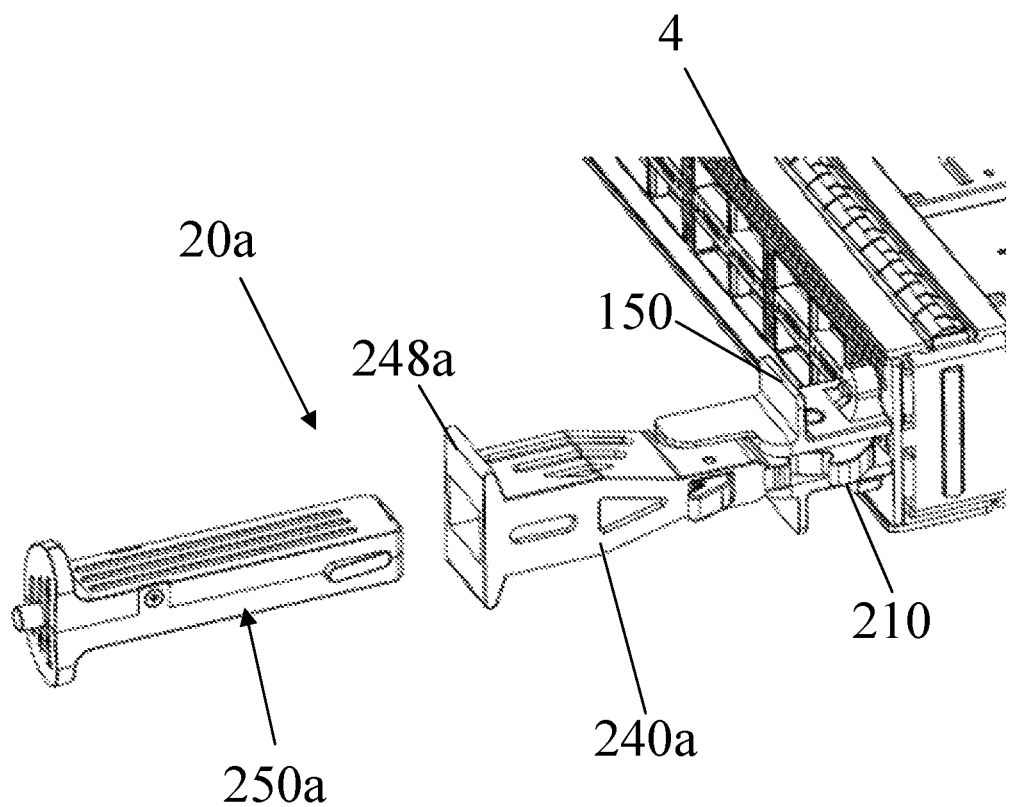
FIG. 11 shows a schematic view of a server chassis having one HR device where the handle is detached from the driving assembly, in accordance with the second embodiment.

In the embodiment shown in FIGS. 7-11, the handle 250a is detachably connected to the guiding member 240a. When the server chassis 4 is to be installed into the rack 3 or removed from the rack 3, the handle 250a is inserted into the guiding member 240a to facilitate the removal/installation process of the server chassis 4 and control the rotation of the driving assembly 20a. After the removal/installation process of the server chassis 4 is completed, as shown in FIG. 11, the handle 250a is detached from the guiding member 240a to decrease the size of the HR device 1a.

Embodiments of the server chassis in the disclosure use the HR device for facilitating removal and installation of the server chassis. The HR device is substantially perpendicular to the server chassis, and the driving assembly of the ejector can rotate along an outer side of the server chassis. Therefore, the rotating movement of the driving assembly is not blocked by the server chassis. In addition, when the handle of the HR device is not in use, the handle is received within the guiding member or removed from the guiding member so that a door of the server chassis can be closed, space in the rack for receiving the HR device is thus saved.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A holding and release device adapted for facilitating a movement of a server chassis relative to a rack, comprising:
   a mounting assembly mounted to the server chassis;
   a fixing member rotatably coupled to the mounting assembly and comprising a first protrusion which fastens the server chassis to the rack;
   a button stage connected to the fixing member, a channel being defined within the button stage;
   a latching button rotatably positioned in the channel and comprising a hook portion configured to engage with the mounting assembly;
   a guiding member connected to the button stage and defining a sliding tunnel therein; and
   a handle slidably coupled to the guiding member and located in the sliding tunnel.

2. The holding and release device of claim 1, further comprising a spring connected between the guiding member and the handle to restore the handle to a previous position after the handle is slid out of the guiding member.

3. The holding and release device of claim 1, wherein the handle is detachably connected to the guiding member and is engaged with the guiding member via at least one block extending out of a housing of the handle.

4. The holding and release device of claim 3, wherein the handle further comprises a control rod extending in the housing, wherein the control rod has an abutting part facing an inclined surface of the block arranged such that when the control rod moves toward the block, the block retracts into the housing to release the handle from the guiding member.

5. The holding and release device of claim 4, wherein the handle further comprises two blocks, and a spring is connected between the two blocks, when the control rod is moved away from the two blocks, the spring keeps the blocks out of the housing and maintains the blocks being engaged with the guiding member.

6. The holding and release device of claim 1, wherein the fixing member further comprises a second protrusion spaced apart from the first protrusion, and a recess for receiving an engaging member of the rack is formed between the first protrusion and the second protrusion.

7. The holding and release device of claim 1, wherein the mounting assembly defines a groove, and a buckle is defined within the groove, wherein the hook portion of the latching button is latched on the buckle to limit the rotation of the fixing member relative to the mounting assembly.

8. The holding and release device of claim 1, wherein the fixing member, the button stage, the guiding member and the handle are sequentially arranged along a longitudinal direction, wherein the fixing member and the latching button are rotated about axes which are perpendicular to the longitudinal direction.

9. The holding and release device of claim 1, wherein the fixing member, the button stage, the guiding member and the handle are sequentially arranged along a longitudinal direction, wherein the handle is moved in the guiding member along a direction that is parallel to the longitudinal direction.

10. The holding and release device of claim 1, wherein the mounting assembly comprises a cable inner blade, and the guiding member or the handle comprises a cable outer blade, the cable inner blade and the cable outer blade are located at a same side of the holding and release device and each has a height to define a space allowing a cable passing therethrough.

* * * * *